United States Patent
Bar-David et al.

(10) Patent No.: US 7,710,203 B2
(45) Date of Patent: May 4, 2010

(54) TRANSFORMER-CAPACITOR ENHANCEMENT CIRCUITRY FOR POWER AMPLIFIERS

(75) Inventors: Israel Bar-David, Haifa (IL); Alexander Veinblat, Haifa (IL)

(73) Assignee: Paragon Communications Ltd., Haifa (IL)

( * ) Notice: Subject to any disclaimer, the term of this patent is extended or adjusted under 35 U.S.C. 154(b) by 170 days.

(21) Appl. No.: 11/912,732

(22) PCT Filed: Apr. 27, 2006

(86) PCT No.: PCT/IL2006/000512

§ 371 (c)(1),
(2), (4) Date: Nov. 13, 2007

(87) PCT Pub. No.: WO2006/114792

PCT Pub. Date: Nov. 2, 2006

(65) Prior Publication Data

US 2009/0295475 A1  Dec. 3, 2009

(51) Int. Cl.
H03F 3/04 (2006.01)
(52) U.S. Cl. ........................ 330/297; 330/127
(58) Field of Classification Search ......... 330/296–297, 330/127, 129, 134, 279
See application file for complete search history.

(56) References Cited

U.S. PATENT DOCUMENTS

| 6,600,376 | B1 | 7/2003 | Yang |
| 6,831,519 | B2 | 12/2004 | Bar-David et al. |
| 7,046,090 | B2 * | 5/2006 | Veinblat ................. 330/285 |
| 2003/0146791 | A1 | 8/2003 | Shvarts et al. |
| 2004/0036530 | A1 | 2/2004 | Matsuura et al. |

FOREIGN PATENT DOCUMENTS

| EP | 0147306 A | 7/1985 |
| WO | WO2004/062095 A | 7/2004 |

* cited by examiner

Primary Examiner—Robert Pascal
Assistant Examiner—Hieu P Nguyen
(74) Attorney, Agent, or Firm—Marsteller & Associates, P.C.

(57) ABSTRACT

Circuitry for providing improved pulse-type enhancement of the voltage supplied to a power amplifier (101) that is fed by a power supply that is connected to the power amplifier (101) at a feeding point through a main supply path that is connected via an inductor (L1). A second feeding point is used for enhancement by a capacitor that is discharged. A transformer L2, L3, M) is formed by mutually coupling an additional inductor (L3), through which an additional supply path is connected. Enhancement power is provided partially through the transformer L2, L3, M) and the remaining part thorough the capacitor (C1). This way, the total level of possible enhancement is increased, while minimizing distortion of the envelope of the amplified RF signal.

7 Claims, 3 Drawing Sheets

Fig. 1 (PRIOR-ART)

Fig. 2 (PRIOR-ART)

TRANSFORMER-CAPACITOR ENHANCEMENT CIRCUITRY FOR POWER AMPLIFIERS

FIELD OF THE INVENTION

The present invention relates to the field of high efficiency power amplifiers. More particularly, the invention relates to a circuitry for efficiently controlling the impedance at a connection point of a power supply to a power amplifier, being a feeding point, and providing enhancement of the voltage that is delivered to said power amplifier via supplementary supply paths that are used to connect the power supply to that point.

BACKGROUND OF THE INVENTION

Several RF systems containing power amplifiers are characterized in recurrent periods of signals having large peak excursions, which should be handled, in order to improve the efficiency of these systems. One way to handle signals with large peak-to-average ratios is to control the DC power supply to a power amplifier. One voltage level is supplied to such a power amplifier whenever the instantaneous amplitude is below a given level (normal operating condition), and an enhanced (and higher) voltage level whenever the instantaneous amplitude is above said level. This solution is described for example, in WO 01/67598, which discloses circuitry for dynamically enhancing the operating voltage of an RF amplifier. However, efficiency of the voltage enhancement circuit disclosed therein may be further increased by controlling the impedance values at the connection point between the power amplifier and the power supply, during normal operation and during voltage enhancement time periods.

It is therefore desired to allow a power amplifier to work under different operating power supply voltages, in response to different input signals or conditions under which the power amplifier, or a component contained within it, operates. For example, in order to optimize the operation of a power amplifier, it has been found beneficial to provide it with a DC power through a first supply path whenever the signal at its input is below a predetermined level, and add a second and a third supplemental power supply paths at instants wherein the signal at its input is above that level, thus enhancing the effective voltage supplied to said power amplifier. This type of solution allows operating a power amplifier in a relatively large dynamic range with high efficiency, as the enhanced operating voltage source is coupled to the circuit only when required by the large instantaneous amplitude.

U.S. Pat. No. 6,831,519B2 discloses circuitry that allows efficient enhancement of the voltage supplied to a power amplifier during required time periods. This circuitry controls the level of the voltage supplied to a power amplifier, via a supplementary supply path that is connected to the feeding point, during both the enhancement period, and periods of normal operation (also called "normal period"). However, the level of enhancement provided by the circuitry of has not been sufficient for more high power applications. In addition, in the circuit of U.S. Pat. No. 6,831,519 the enhancement current is provided by a coupling capacitor, which has a limited capability to pass low frequency components of the enhancement pulse.

It is therefore an object of the present invention to provide improved circuitry that allows efficient enhancement of the voltage supplied to a power amplifier during enhancement periods, while minimizing envelop distortion of the amplified RF signals.

It is another object of the present invention to provide improved circuitry for efficiently controlling the level of the voltage supplied to a power amplifier, via two supplementary supply paths that are connected to the feeding point, during both the enhancement period, and periods of normal operation.

It is another object of the present invention to provide improved circuitry for efficiently controlling the impedance at that feeding point in the direction of the power amplifier and of the supplementary supply path, during both the enhancement period, and the normal period.

Other objects and advantages of the invention will become apparent as the description proceeds.

SUMMARY OF THE INVENTION

The present invention is directed to an improved method for allowing improved pulse-type enhancement of the voltage supplied to a power amplifier fed by a power supply being connected to the power amplifier at a first feeding point through a main supply path connected via a first inductor having a high impedance to an enhancement pulse at the feeding point, and to a second feeding point. A first supplementary supply path is used for providing enhanced operating voltage to the power amplifier that is connected to a first power supply. A pair of a first and a second controllable impedances that are connected by a common contact is provided and have a separate control input and being capable of being in a non-conducting state is also provided. At least one of them is capable of being in a desired variable level of conduction up to full conduction. A second supplementary supply path is used for providing enhanced operating voltage to the power amplifier, through a second inductor that is connected to a second power supply and to the common contact. One contact of the first controllable impedance is connected to the second feeding point, while the first power supply is connected across the contacts of the pair which are not connected to the common contact. A capacitor is connected between the common contact and the first feeding point and an inductive pair is formed by generating mutual coupling between the first and second inductors.

During the time period when no enhancement is required, the first controllable impedance is controlled through its separate control input, to be in its conducting state and effectively connect the common contact to the second feeding point of one of the first power supply and the second power supply. At the same time, the second controllable impedance, is controlled through its separate control input, to be in its non-conducting state. The common contact is effectively disconnected from the second feeding point and the capacitor is charged to essentially the voltage of the power supply.

during the time period when enhancement is required, the first controllable impedance is controlled through its separate control input, to effectively disconnect the common contact from one contact of power supply. At the same time, the second controllable impedance is controlled through its separate control input, to be in a conduction level that corresponds to a desired enhancement voltage level at the first feeding point, such that a portion of the required enhancement power is supplied by the inductive pair and another portion is supplied by the capacitor. By doing so, the magnitude of the voltage at the common point, to which a contact of the capacitor is connected, is increased, while causing an essentially similar increase in the voltage at the first feeding point, to which the other contact of the capacitor is connected, up to the desired enhancement voltage level. The inductors forming the pair may be wound on the same core, so as to form a transformer.

The present invention is directed to a circuitry for providing improved pulse-type enhancement of the voltage supplied to a power amplifier fed by a power supply being connected to the power amplifier at a first feeding point through a main supply path connected via a first inductor having a high impedance to an enhancement pulse at the feeding point, and to a second feeding point, that comprises:

a) a first supplementary supply path for providing enhanced operating voltage to the power amplifier connected to a first power supply;

b) a pair of a first and a second controllable impedances being connected by a common contact, each of which having a separate control input and being capable of being in a non-conducting state, and at least one of which is capable of being in a desired variable level of conduction up to full conduction, such that one contact of the first controllable impedance is connected to the second feeding point and the first power supply is connected across the contacts of the pair which are not connected to the common contact;

c) a second supplementary supply path for providing enhanced operating voltage to the power amplifier, through a second inductor, connected to a second power supply and to the common contact;

d) a capacitor, connected between the common contact and the first feeding point; and e) an inductive pair, formed by generating mutual coupling between the first and second inductors.

The circuitry is configured such that during the time period when no enhancement is required, the first controllable impedance is controlled to be in its conducting state and effectively connect the common contact to the second feeding point of one of the first power supply and the second power supply, and the second controllable impedance is controlled to be in its non-conducting state and thereby, effectively disconnecting the common contact from the second feeding point and allowing the capacitor to charge to essentially the voltage of the power supply; and The circuitry is also configured such that during the time period when enhancement is required, the first controllable impedance is controlled to effectively disconnect the common contact from one contact of the, or another power supply, and the second controllable impedance is controlled to be in a conduction level that corresponds to a desired enhancement voltage level at the first feeding point, such that a portion of the required enhancement power is supplied by the inductive pair and another portion is supplied by the capacitor.

The controllable impedance may comprises a bipolar transistor or a FET. The first and second inductors are wound on the same coil, so as to form a transformer.

Preferably, during the time period when enhancement is required, the first and/or the second controllable impedances are controlled by pulse signals having a duration which is essentially similar to the time period.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

Figure 1:
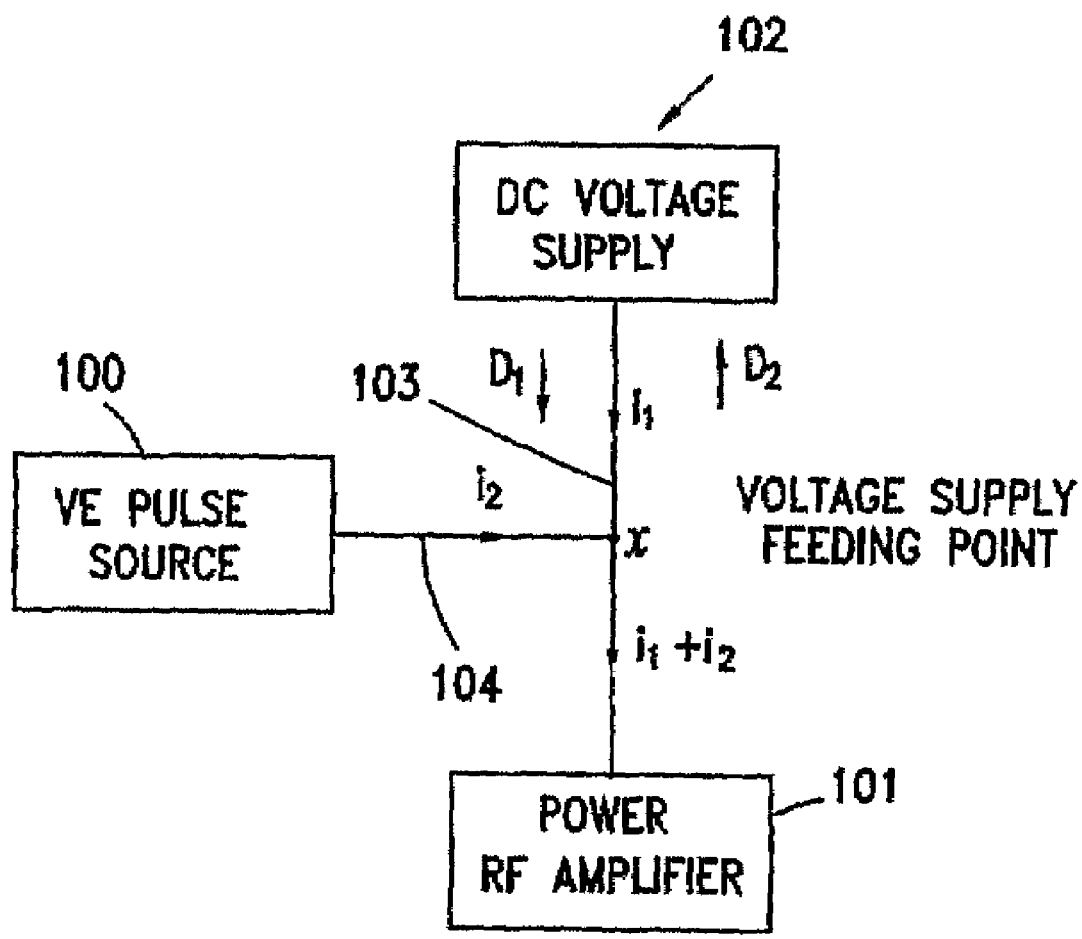
FIG. 1 is a block diagram of a circuitry that controls the level of enhancement of the voltage supplied to a power amplifier, according to prior art.

FIG. 1 is a block diagram of a circuitry that controls the level of enhancement of the voltage supplied to a power amplifier, according to prior art. The power amplifier 101 is supplied with operating voltage through a feeding point x, which is connected to a DC voltage supply 102 via the main supply path 103, and to a voltage enhancement pulse source 100, via a supplementary supply path 104. The Voltage Enhancement (VE) circuitry 100 increases the supply voltage at the feeding point x for a relatively short duration (in the order of the reciprocal of the modulation bandwidth), when voltage enhancement is required. Under normal operation conditions (i.e., when no enhancement is required), the feeding point x has an extremely low resistance to the DC current $i_1$ consumed from the DC voltage supply circuitry 102 (in the direction D1). During the same normal operation period, the VE pulse source 100 causes feeding point x to have an extremely low impedance to all the frequency components of the fluctuating current $i_2$ generated by the power amplifier 101.

According to a preferred embodiment of the invention, during the relatively short duration when a (large) peak in $i_2$ is required, the VE pulse source 100 issues a VE pulse and the DC voltage supply 102 concurrently allows the feeding point x to have a high impedance in the direction D2, such that the VE pulse is fully directed into the power amplifier 101, rather than being short-circuited into the DC voltage supply 102. Therefore, during the VE period the effective current $i_1+i_2$, supplied to the power amplifier 101 comprises an enhanced component $i_2$, as required by the large instantaneous amplitude of the RF signal amplified by the power amplifier 101.

Figure 2:
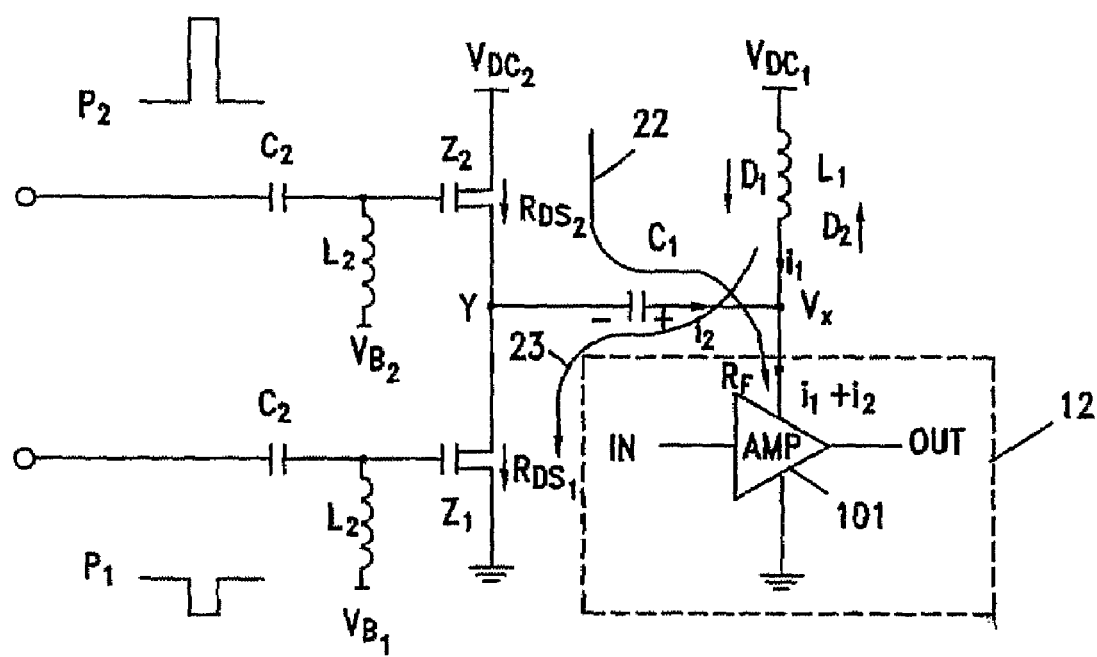
FIG. 2 schematically illustrates an implementation of a circuitry that controls the level of enhancement of the DC power that is supplied to a power amplifier according to prior art.

FIG. 2 schematically illustrates an implementation of the circuitry of FIG. 1, according to prior art. The VE circuitry 100 consists of two serially connected controllable impedances and (e.g., FETs or bipolar transistors), which are also connected between the contacts of the power supply $V_{DC_1}$, or of a supplementary power supply $V_{DC_2}$. The power supply $V_{DC_1}$, used to supply power to the power amplifier 101 under normal operation conditions, is connected to the feeding point x through a serial inductor $L_1$, which is selected to introduce extremely high impedance to the issued VE pulse, in the direction D2. The common point of controllable impedances Z1 and Z2 is connected to the voltage supply feeding point by a capacitor $C_1$. The value of $C_1$ is selected to introduce low impedance to all the frequency components of the fluctuating current generated by the power amplifier 101. In addition, the value of $C_1$ should be sufficiently large for supplying the excess current $i_2$ for the (short) duration when the VE pulse is issued. During normal operation, the fluctuating components of $i_2$ flow through capacitor C1.

Controllable impedances Z1 and Z2 are implemented in this example using Field-Effect-Transistors (FETs), each of which is properly biased by an inductor $L_2$ (which also serves as a choke for the exciting pulses, P1 and P2) connecting their gates to the biasing voltages $V_{B1}$ and $V_{B2}$, respectively. Controllable impedances Z1 and Z2 are controlled by separate control pulses, P1 and P2, respectively, through corresponding serial capacitors C2, which serve as DC-blocks (in order to isolate the control signals from the biasing voltages $V_{B1}$ and $V_{B2}$.

$V_{B1}$ is selected such that during normal operation conditions, Z1 is in full conduction, effectively short-circuiting point y to ground by becoming a negligible impedance to ground. $V_{B2}$ is selected such that during normal operation conditions, Z2 is effectively an open-circuit. In this state, the supplemental $V_{DC_2}$ is essentially disconnected from the feeding point x. Consequently, $i_2$ flows through C1 and Z1 to ground, as required for proper operation of the power amplifier 101, while $i_1$ flows through capacitor C1. Simultaneously, capacitor C1 is charged to a voltage that essentially equals $V_{DC_1}$.

When VE is required, Z1 is forced by P1 to enter into its non-conducting state, having effectively infinite impedance, thereby effectively disconnecting $C_1$ from ground. Simultaneously, Z2 is allowed to be in a conducting level that corresponds to the amount of VE that is required, by properly controlling the level of P2. This allows the voltage at point y to rise above zero and by virtue of capacitor C1, to enhance the voltage at point x. At this stage, C1 discharges into the power amplifier 101 through the feeding point x, thereby causing the supplemental current $i_2$ to flow in direction 22 for the duration of the control pulse $P_2$. The level of enhancement depends on the value of the impedance $R_{DS_2}$ (i.e., the impedance of Z2 while being in the appropriate conducting measure). Lower value of $R_{DS_2}$ results in higher level of enhancement. The duration of the VE pulse is determined by the duration of the control pulse P2. The voltage level $V_X$ at the feeding point x increases at the switching moment by a level determined by $R_{DS_2}$ and the value of $V_{DC_2}$. The maximum value of enhancement is obtained when $R_{DS_2}=0$ and when $V_x$ equals the sum of the voltage $V_{DC_1}$ and the voltage across capacitor C1, which is $V_{DC_1}+V_{DC_2}$. During the VE period, capacitor C1 discharges slightly, while participating in the VE process.

After the enhancement period is terminated, that is the control pulses P1 and P2 are terminated and Z2 returns to its non-conducting state. Concurrently, Z1 is controlled to re-enter its conducting state, also allowing C1 to recharge via path 23 to $V_{DC_1}$ and be ready for the next required VE period.

Figure 3:
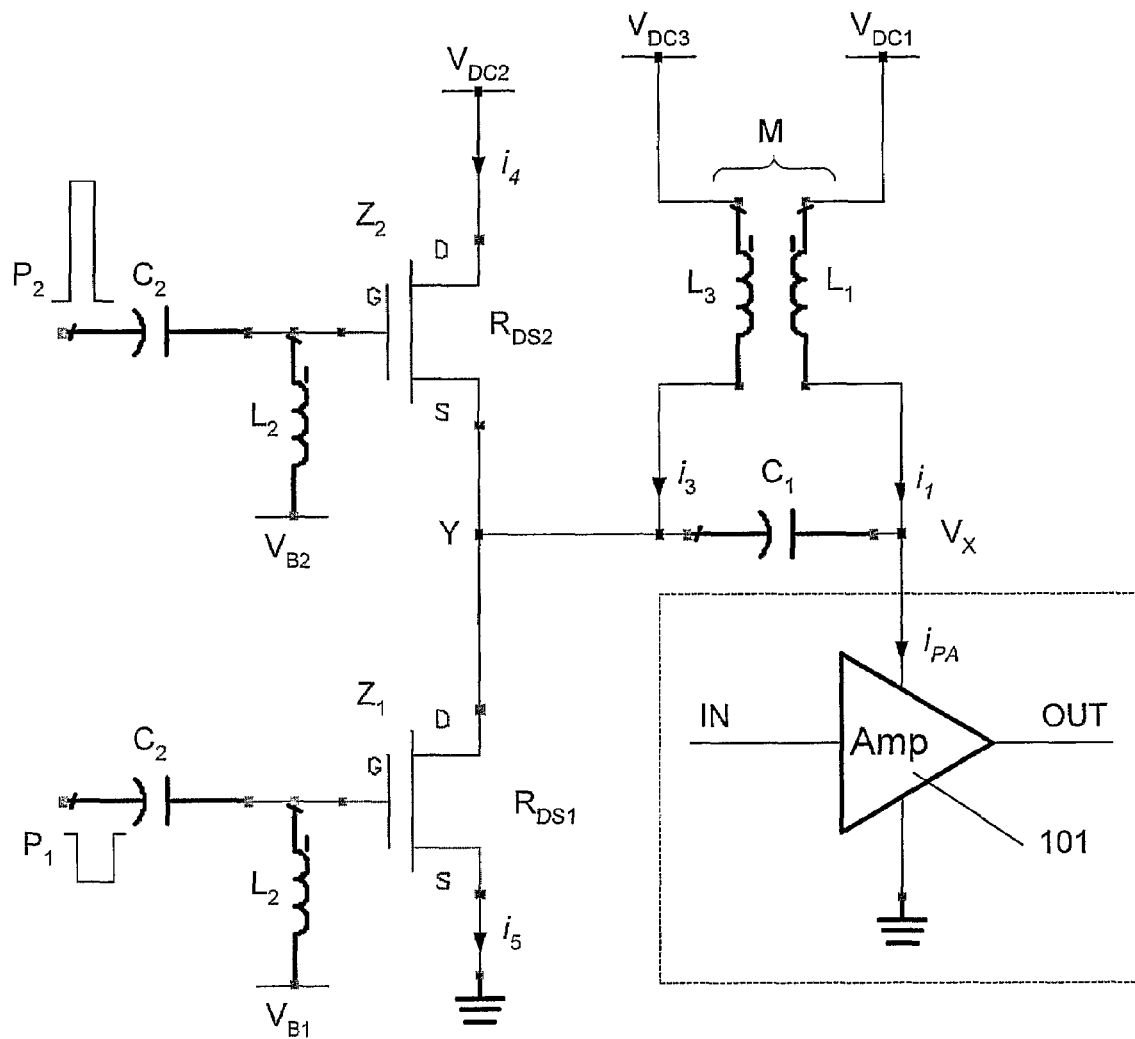
FIG. 3 schematically illustrates the implementation of a circuitry that includes additional supplementary path to better control the level of enhancement of the DC power that is supplied to a power amplifier, according to a preferred embodiment of the invention.

FIG. 3 schematically illustrates an improved implementation of the circuit illustrated by FIG. 1, according to a preferred embodiment of the present invention. An ancillary low voltage power supply $V_{DC3}$ is connected to by adding an inductor $L_3$. During normal period, the DC current $I_3$ that flows through $L_3$ continues to ground via the controllable impedance $Z_1$. During an enhancement period when the path trough $Z_1$ is blocked by a pulse P1, part of $I_3$ is diverted to flow, via $C_1$, into the RF amplifier. The additional inductor $L_3$, possibly wound on the same core as inductor $L_1$ to form a transformer with mutual coupling M, is connected on one side to the common point y of the controllable impedances Z1 and Z2 and on the other side to the additional power supply $V_{DC3}$. Here, when $I_{PA}$ is at its quiescent value (i.e., no enhancement) and has no fluctuations, $i_3$ equals $i_5$ and flows to ground via Z1. The value of the voltage $V_{DC3}$ equals $i_3$ times $R_{DS1}$, which is a very low voltage, due to the fact that Z1 is in its conducting state. The advantages owed to the thus-formed second supplementary power path will be illustrated while considering the currents identified in FIG. 3.

In the case that the inductors $L_1$ and $L_3$ are wound on different cores, that is M=0, $i_1$ as well as is are forced to remain practically constant even during an enhancement pulse. During normal period, the varying component of the Power Amplifier current $I_{PA}$ flows via capacitor $C_1$ and is subtracted from $i_5$. During enhancement period, when $I_{PA}$ needs to be very large, pulse $P_1$ restricts the current $i_5$ even more, such that a part or even all of $i_3$ contributes to the increased $I_{PA}$. At full enhancement, $i_5$ becomes zero and pulse $P_2$ enables the largest $i_4$ to flow and therefore $I_{PA}=i_1+i_3+i_4$.

In the case that $L_3$ and $L_1$ are wound on the same core, such that $L_1=L_3=L$ and M is close to L, a transformer is formed and only the sum $i_1+i_3$ is forced to remain practically constant. Thus, $i_1$ can increase if $i_3$ decreases and vice versa. Then, during the enhancement period, fluctuations in $I_{PA}$ can still flow via $L_1$ until all the current $i_3$ is exhausted for satisfying the requirement of $i_{PA}$. If the enhancement needed is above this value, the $i_4$ current through $C_1$ is needed to supply $I_{PA}=i_1+i_3+i_4$. Therefore, the enhancement is provided partially through the transformer and the remaining part thorough the coupling capacitor $C_1$. This way, the total level of possible enhancement is increased, while minimizing distortion of the envelop of the amplified RF signal, since low frequency components of the enhancement pulse are transferred to the output of the enhancement circuitry by the transformer, while high frequency components of the enhancement pulse are transferred to the output of the enhancement circuitry by $C_1$.

The above examples and description have of course been provided only for the purpose of illustration, and are not intended to limit the invention in any way. As will be appreciated by the skilled person, the invention can be carried out in a great variety of ways, employing more than one technique from those described above, all without exceeding the scope of the invention.

The invention claimed is:

1. A method for allowing improved pulse-type enhancement of the voltage supplied to a power amplifier fed by a power supply being connected to said power amplifier at a first feeding point through a main supply path connected via a first inductor having a high impedance to an enhancement pulse at said feeding point, and to a second feeding point, comprising:

a) providing a first supplementary supply path for providing enhanced operating voltage to said power amplifier connected to a first power supply;
   b) providing a pair of a first and a second controllable impedances being connected by a common contact, each of which having a separate control input and being capable of being in a non-conducting state, and at least one of which is capable of being in a desired variable level of conduction up to full conduction;
   c) providing a second supplementary supply path for providing enhanced operating voltage to said power amplifier, through a second inductor, connected to a second power supply and to said common contact;
   d) connecting one contact of said first controllable impedance to said second feeding point;
   e) connecting said first power supply across the contacts of said pair which are not connected to said common contact;
   f) connecting a capacitor between said common contact and said first feeding point; forming an inductive pair by generating mutual coupling between said first and second inductors;
   g) during the time period when no enhancement is required, simultaneously and separately controlling said first controllable impedance through its separate control input, to be in its conducting state and effectively connect said common contact to said second feeding point of one of said first power supply and said second power supply, and controlling said second controllable impedance, through its separate control input, to be in its non-conducting state and thereby, effectively disconnecting said common contact from said second feeding point and allowing said capacitor to charge to essentially the voltage of said power supply;

h) during the time period when enhancement is required:

i) controlling said first controllable impedance, through its separate control input, to effectively disconnect said common contact from one contact of said, or another power supply; and j) simultaneously and separately, controlling said second controllable impedance, through its separate control input, to be in a conduction level that corresponds to a desired enhancement voltage level at said first feeding point, such that a portion of the required enhancement power is supplied by said inductive pair and another portion is supplied by said capacitor, thereby increasing the magnitude of the voltage at said common point, to which a contact of said capacitor is connected, and thereby causing an essentially similar increase in the voltage at said first feeding point, to which the other contact of said capacitor is connected, up to said desired enhancement voltage level.

2. A method according to claim 1, wherein the inductors forming the pair are wound on the same core, so as to form a transformer.

3. Circuitry for providing improved pulse-type enhancement of the voltage supplied to a power amplifier fed by a power supply being connected to said power amplifier at a first feeding point through a main supply path connected via a first inductor having a high impedance to an enhancement pulse at said feeding point, and to a second feeding point, comprising:

a) a first supplementary supply path for providing enhanced operating voltage to said power amplifier connected to a first power supply;

b) a pair of a first and a second controllable impedances being connected by a common contact, each of which having a separate control input and being capable of being in a non-conducting state, and at least one of which is capable of being in a desired variable level of conduction up to full conduction, such that one contact of said first controllable impedance is connected to said second feeding point and said first power supply is connected across the contacts of said pair which are not connected to said common contact;

c) a second supplementary supply path for providing enhanced operating voltage to said power amplifier, through a second inductor, connected to a second power supply and to said common contact;

d) a capacitor, connected between said common contact and said first feeding point;

e) an inductive pair, formed by generating mutual coupling between said first and second inductors;

said circuitry is configured such that during the time period when no enhancement is required:

said first controllable impedance is controlled to be in its conducting state and effectively connect said common contact to said second feeding point of one of said first power supply and said second power supply, and said second controllable impedance is controlled to be in its non-conducting state and thereby, effectively disconnecting said common contact from said second feeding point and allowing said capacitor to charge to essentially the voltage of said power supply; and such that during the time period when enhancement is required:

said first controllable impedance is controlled to effectively disconnect said common contact from one contact of said, or another power supply, and said second controllable impedance is controlled to be in a conduction level that corresponds to a desired enhancement voltage level at said first feeding point, such that a portion of the required enhancement power is supplied by said inductive pair and another portion is supplied by said capacitor.

4. Circuitry according to claim 3, wherein the controllable impedance comprises a bipolar transistor.

5. Circuitry according to claim 3, wherein the controllable impedance comprises a FET.

6. Circuitry according to claim 3, wherein said first and second inductors are wound on the same coil, so as to form a transformer.

7. Circuitry according to claim 3, wherein during the time period when enhancement is required, the first and/or the second controllable impedances are controlled by pulse signals having a duration which is essentially similar to said time period.

* * * * *